(12) United States Patent
Pruitt

(10) Patent No.: US 7,960,845 B2
(45) Date of Patent: Jun. 14, 2011

(54) FLEXIBLE CONTACTLESS WIRE BONDING STRUCTURE AND METHODOLOGY FOR SEMICONDUCTOR DEVICE

(75) Inventor: David Alan Pruitt, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 111 days.

(21) Appl. No.: 12/003,883

(22) Filed: Jan. 3, 2008

(65) Prior Publication Data

US 2009/0174043 A1    Jul. 9, 2009

(51) Int. Cl.
  *H01L 21/60* (2006.01)
  *H01L 23/495* (2006.01)
  *H01L 23/48* (2006.01)
  *H01L 23/52* (2006.01)
  *H01L 29/40* (2006.01)

(52) U.S. Cl. ........ 257/784; 257/401; 257/691; 257/779; 257/735; 257/672

(58) Field of Classification Search .................. 257/666, 257/784, 779, 401, 735, 672, 691
See application file for complete search history.

(56) References Cited

U.S. PATENT DOCUMENTS

| | | | |
|---|---|---|---|
| 3,922,385 A * | 11/1975 | Konantz et al. ............... | 438/614 |
| 4,103,267 A | 7/1978 | Olschewski | |
| 4,780,795 A | 10/1988 | Meinel | |
| 5,409,866 A * | 4/1995 | Sato et al. ....................... | 29/827 |
| 5,763,952 A * | 6/1998 | Lynch et al. ................... | 257/735 |
| 5,861,662 A * | 1/1999 | Candelore ...................... | 257/679 |

(Continued)

FOREIGN PATENT DOCUMENTS

DE    10 2005 054 872 A1    5/2007

(Continued)

OTHER PUBLICATIONS

International Search Report and the Written Opinion of the International Searching Authority issued in International Patent Application No. PCT/US2008/088327 dated Jun. 23, 2009.

(Continued)

*Primary Examiner* — Teresa M Arroyo
(74) *Attorney, Agent, or Firm* — McDermott Will & Emery LLP

(57) ABSTRACT

A semiconductor device such as a field-effect transistor, improved to reduce device resistance, comprises a leadframe which includes a die paddle integral with a first set of leads and a second set of leads that is electrically isolated from the first set, a semiconductor die having its lower surface positioned on, and electrically connected to, the die paddle, and a conductive layer on the upper surface of the die. At least one electrically conductive wire, preferably plural wires, extend laterally across the second surface of the semiconductor die, are in electrical contact with the conductive layer, and interconnect corresponding second leads on opposite sides of the die. The plural wires may be welded to leads in succession by alternate ball and wedge bonds on each lead. The conductive layer may be an aluminized layer on which is formed a thin layer a solderable material, such as tin. A solder is deposited on the tin layer, enmeshing the wires. The wires, which preferably are made of copper, then may be bonded to the electrically conductive layer by melting the solder paste, preferably by heating the leadframe, allowing the solder to reflow and wet the wires, and then cool to produce a low resistance mass between the leads.

17 Claims, 5 Drawing Sheets

U.S. PATENT DOCUMENTS

| | | | |
|---|---|---|---|
| 5,926,358 | A | 7/1999 | Dobkin et al. |
| 5,959,462 | A | 9/1999 | Lum |
| 6,052,289 | A * | 4/2000 | Schoenfeld et al. .......... 361/813 |
| 6,242,800 | B1 | 6/2001 | Munos et al. |
| 6,369,454 | B1 * | 4/2002 | Chung .......................... 257/787 |
| 6,380,048 | B1 * | 4/2002 | Boon et al. .................... 438/456 |
| 6,597,065 | B1 * | 7/2003 | Efland ........................... 257/712 |
| 6,703,692 | B1 | 3/2004 | Pruitt |
| 6,770,982 | B1 * | 8/2004 | Liou ............................. 257/784 |
| 6,841,421 | B2 * | 1/2005 | Aono et al. ................... 438/121 |
| 6,847,101 | B2 * | 1/2005 | Fjelstad et al. ................ 257/668 |
| 6,905,954 | B2 * | 6/2005 | Hedler et al. ................. 438/612 |
| 7,002,238 | B2 * | 2/2006 | Behzad ......................... 257/662 |
| 7,045,831 | B2 * | 5/2006 | Narazaki ....................... 257/177 |
| 7,064,442 | B1 | 6/2006 | Lane et al. |
| 7,075,329 | B2 | 7/2006 | Chen et al. |
| 7,132,314 | B2 * | 11/2006 | Matsunami ................... 438/123 |
| 7,135,763 | B2 * | 11/2006 | Stroupe ......................... 257/690 |
| 7,154,165 | B2 | 12/2006 | Pruitt |
| 7,154,940 | B2 | 12/2006 | Scott et al. |
| 7,397,137 | B2 * | 7/2008 | Larking ........................ 257/784 |
| 7,408,260 | B2 * | 8/2008 | Fjelstad et al. ................ 257/734 |
| 7,447,492 | B2 | 11/2008 | Dupuis |
| 7,732,930 | B2 * | 6/2010 | Makino et al. ................ 257/777 |
| 2001/0017412 | A1 * | 8/2001 | Asazu et al. .................. 257/737 |
| 2001/0040277 | A1 * | 11/2001 | Lam et al. ..................... 257/675 |
| 2006/0017141 | A1 | 1/2006 | Luo et al. |
| 2006/0276155 | A1 | 12/2006 | Feldtkeller |
| 2007/0018338 | A1 * | 1/2007 | Hosseini et al. .............. 257/784 |
| 2007/0081280 | A1 | 4/2007 | Strzalkowski et al. |
| 2009/0032975 | A1 * | 2/2009 | Do et al. ....................... 257/784 |

FOREIGN PATENT DOCUMENTS

EP    0 418 749 A    3/1991

OTHER PUBLICATIONS

United States Office Action issued in U.S. Appl. No. 12/202,835 dated Jun. 22, 2010.

U.S. Appl. No. 12/202,835, filed Sep. 2, 2008.

International Preliminary Report on Patentability dated Jul. 15, 2010.

* cited by examiner

FLEXIBLE CONTACTLESS WIRE BONDING STRUCTURE AND METHODOLOGY FOR SEMICONDUCTOR DEVICE

FIELD OF THE INVENTION

This disclosure relates generally to semiconductor device manufacture, such as a field-effect transistor, and more particularly to an improved structure for and methodology of wire bonding without welding, and in which wire interconnect resistance is considerably reduced.

BACKGROUND

A typical integrated circuit package includes a semiconductor die having an array of die output/input bond pads and some means, such as a leadframe, for supporting the die and providing leads for interconnecting the bond pads with external circuitry. The leadframe generally comprises a die paddle on which the die is positioned, and an array of laterally extending electrically conductive leads connected to corresponding die bond pads through cooperating bond wires. In some applications, the die may contain a complex array of electrical components; in others the die may contain a single, or small number of larger components such as one or more field effect transistors that may be used for high power switching. In the example of a field-effect transistor, bond wires, generally gold, are ball bonded to an aluminized surface of the die that will form the source by a welding process in which vibration, pressure and heat are implemented to create a weld. The opposite ends of the bond wires are wedge bonded to the lead tips of the device.

FIG. 1 shows an example of wire bonds arranged between a semiconductor die forming a field-effect transistor device 100 and an array of laterally extending leads that protrude from the package that will complete the device. The device 100, which in FIG. 1 is in an intermediate stage of fabrication, comprises a leadframe 102 which consists of a die paddle 104 supporting a semiconductor die 106, corner leads 108 at the four corners of and integral with the paddle, and a number of independent leads 110 that extend laterally, but are spaced apart, from the paddle. In FIG. 1, six leads 110 are shown although the leads could be greater or fewer in number. The leadframe 102 further includes a tie bar 112 which, when encapsulated in a mold compound, helps to maintain the device 100 in stable assembly.

An aluminum metallization layer 116 is formed on the upper surface of the die 106. In the example of a field-effect transistor, the layer 116 may form a source electrode, and the die paddle on the undersurface of the die may form a drain electrode. A gate electrode 118 may be established through the metallization layer 116, as depicted. The drain electrode is connected to corner leads 108 through a layer of conductive paste which also secures die 106 to paddle 104.

An electrical connection is established between the source electrode 116 and leads 110 through a multiplicity of gold or copper wires 120, which extend from points on the electrode to lead tip portions of the leads 110. Conventionally, a connection between a bonding wire and the surface layer is made using a welding tool to ball bond one end of a wire to the electrode, as at 120a, and wedge bonding the opposite end of the wire to a counterpart lead tip 110 (in this example, the lower left hand corner lead). This process can be repeated for each lead (in which there are twelve in FIG. 1, six on each side of the lead frame). The wire ball bonds may be staggered on the surface of the metallization layer 116, as depicted, to distribute current in the source.

A molding compound is now applied to encapsulate the die paddle, bond wires and leads. Thereafter, the leads are detached from the common connection with the lead frame 102, in a process known as "singulation."

The performance of a field-effect transistor is determined, in part, by the amount of electrical resistance that exists between leads 120 at the source electrode and corner leads 108 at the drain. The composite resistance that resides in the device is the sum of several resistance components: a first resistance component between a lead tip 110 and the source electrode 116 representing resistance of the wire and contact resistance between wire and lead tip, and wire and electrode; a second component comprising the resistance of the source layer 116; a third resistance comprising the resistance of die 106; and a fourth component comprising the resistance of the conductive paste between the die and die paddle 104 which is integral with leads 108. The composite resistance should be minimized to enable the field-effect transistor to conduct as much current as possible without substantial heating, and to realize other performance objectives.

To reduce the magnitude of composite resistance in the device, although not depicted, a multiplicity of wires can be connected between the source electrode and a common lead tip to reduce minimize resistance between the source electrode and the leads. For example, if two wires 120 are connected between each lead tip and the source electrode, the assembly will consist of twenty-four wire connections. Because two wires extend between the source electrode and each lead 110, the effective resistance of a connection between the electrode and each lead is reduced by one-half. However, using this technique, source electrode resistance remains unchanged and relatively substantial, and limits reduction in composite resistance that currently is practical. Improvement is desired.

Another deficiency in prior art is in the manner of connecting bond wires to the source electrode—by welding, a destructive process. Yield would be improved by eliminating the need to weld bond wires to the source electrode or other active portion of the die.

SUMMARY

In accord with the teachings herein, a semiconductor device which is improved to reduce device resistance comprises a leadframe which includes a die paddle integral with a first set of leads, and a second set of leads that are electrically isolated from the first set, a semiconductor die having a lower surface positioned on, and electrically connected to, the die paddle, and a layer of conductive material on an upper surface of the semiconductor die. At least one electrically conductive wire, and preferably plural wires, extend laterally across the upper surface of the semiconductor die, are in electrical contact with the conductive material, and interconnect corresponding leads of the second set of leads on opposite sides of the die. The plural wires may be welded to common leads by alternate ball and wedge bonds on each lead tip.

The layer of electrically conductive material may be an aluminized layer on which is formed a thin layer of solderable material, such as tin, on which solder is deposited, enmeshed with the wires. The wires, which preferably are made of copper, then may be bonded to the electrically conductive layer by melting the solder, preferably by heating the leadframe, to reflow the solder and wet the wires. The solder then is allowed to solidify.

The semiconductor device may be a field-effect transistor, in which the conductive layer forms a source electrode, the die paddle forms a drain electrode, and a gate electrode is formed in the die, through the source electrode. Reduced resistance between leads and die as provided herein enables performance of the transistor to be considerably improved.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DETAILED DESCRIPTION

Figure 1:
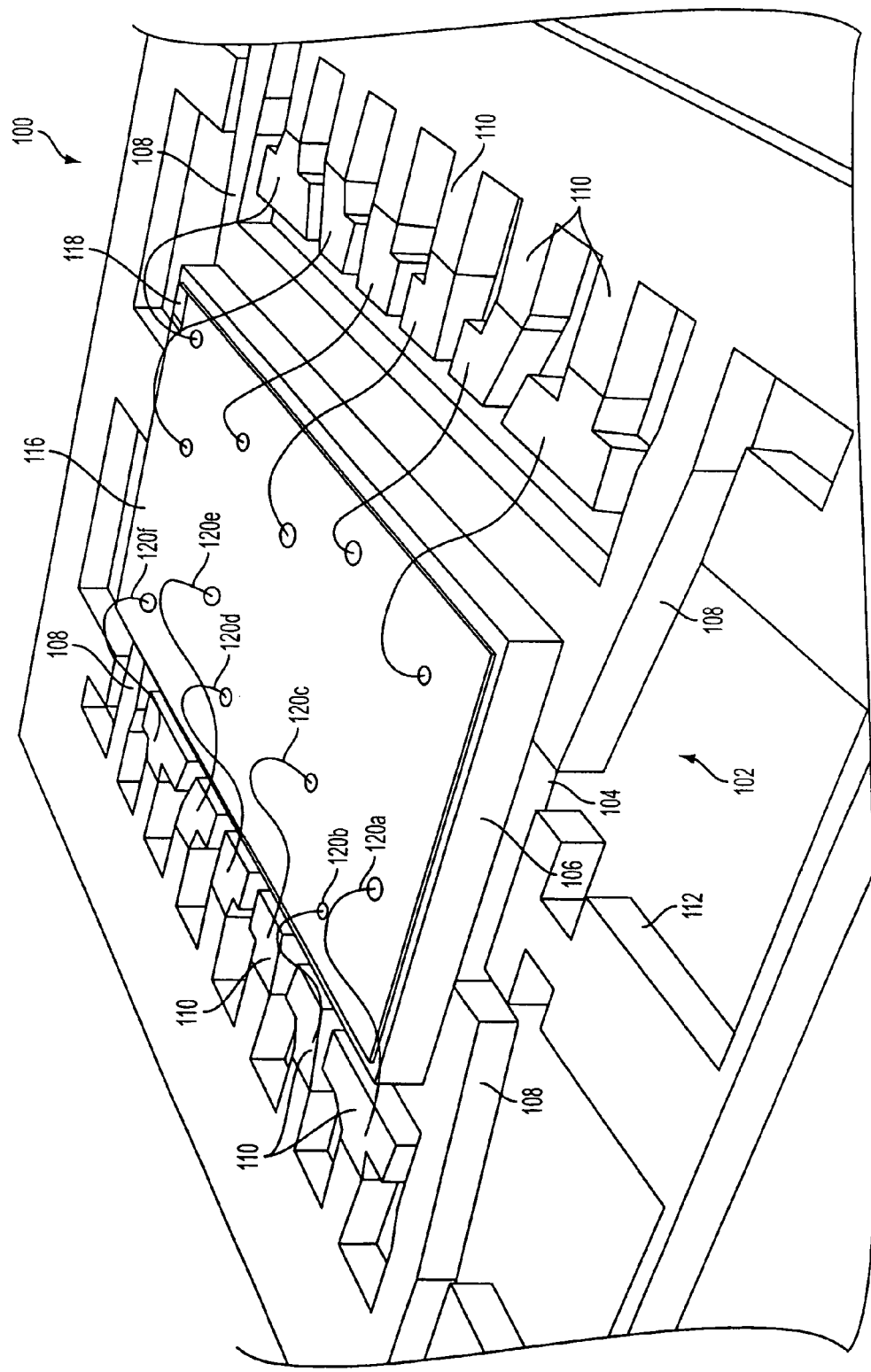
FIG. 1 is a perspective view showing a field-effect transistor assembly, prior to singulation and packaging, in accord with the prior art.
Figure 2:
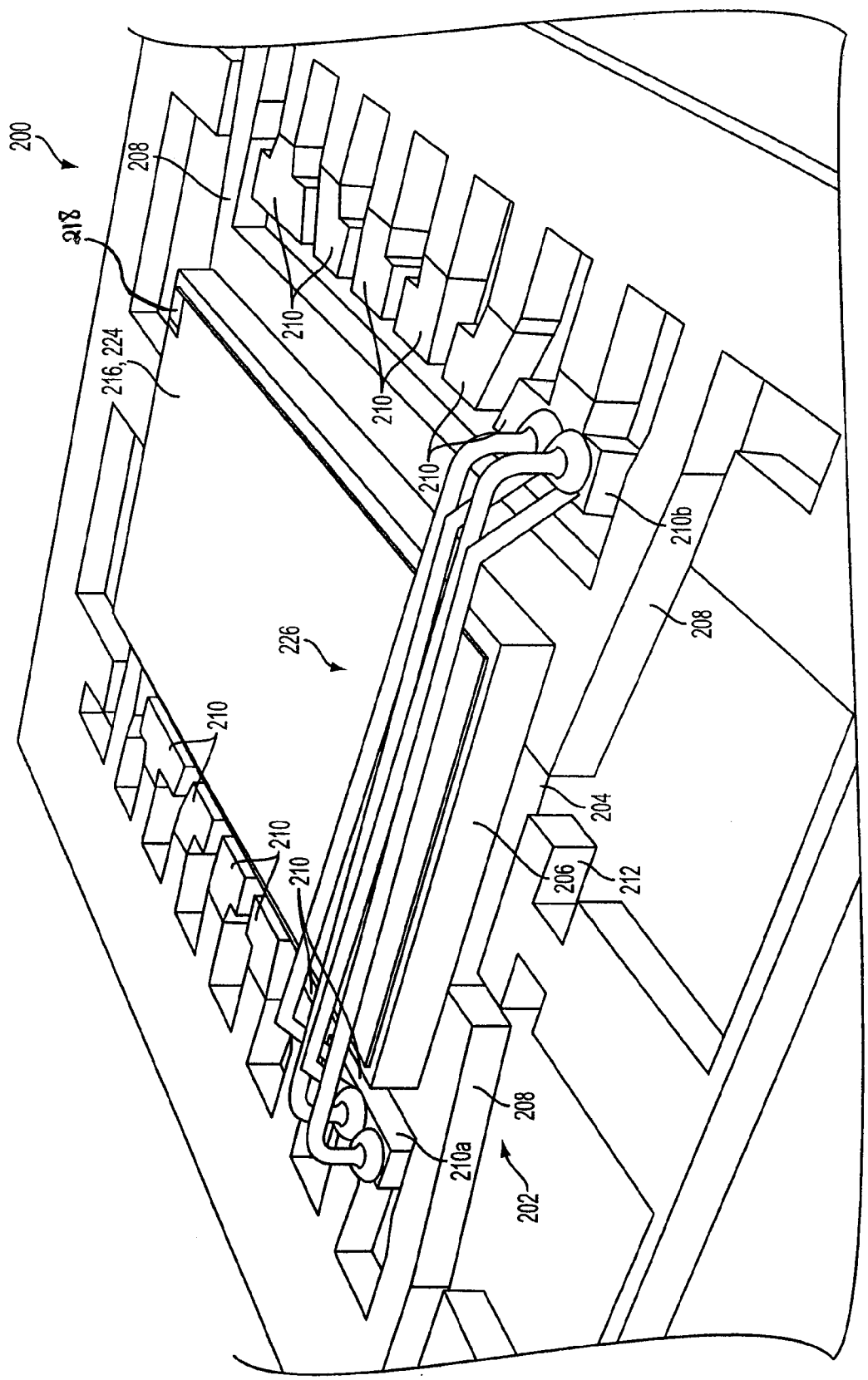
FIG. 2. is a perspective view showing the assembly, improved in accord with the teachings herein.

Referring to FIG. 2, depicted is an integrated circuit assembly, in the exemplary form of a field-effect transistor 200, that is similar to that shown in FIG. 1. However, the manner and structure with which leads 210 and the die 208 are interconnected has been improved.

The device 200, which, as in FIG. 1, is in an intermediate stage of fabrication, comprises lead frame 202 which includes a die paddle 204 supporting a semiconductor die 206, corner leads 208 at the four corners of, and integral with, the paddle, and independent leads 210 that extend laterally, but are separated from, the paddle. As in FIG. 1, six leads 210 are shown in FIG. 2, although the leads could be greater or fewer in number. The lead frame 202 further includes tie bar 212 which connects the die paddle 204 to the leadframe 202 (although shown in detached form in FIG. 2), and when encapsulated in a mold compound, helps to maintain the device 200 in stable assembly.

An aluminum layer 216 is formed on the upper surface of the 206. In the example of a field-effect transistor, as has been described in relation to FIG. 1, the layer 216 may form a source electrode, and the undersurface of the die (on paddle 204) may form a drain electrode. A gate electrode 218 may be established through the metallization layer 216, as depicted. The drain electrode is connected to corner leads 208 through a layer of conductive paste, for example, solder, which also secures the die 206 to the die paddle 204.

A difference between the transistor 100 of FIG. 1 and transistor 200 of FIG. 2 is in the wire interconnect structure which connects the source electrode 216 with leads 208. In the described embodiment, the surface of aluminum layer 216, the source electrode, is coated with a thin layer 224, see FIG. 3, of solderable material, such as tin. At least one, but advantageously a plurality of wires 226, preferably made of copper, are connected between corresponding leads 210 of the leadframe 204, and straddle the die in contact with the source electrode 216 throughout most or all of the lateral extent of the electrode.

Figure 3:
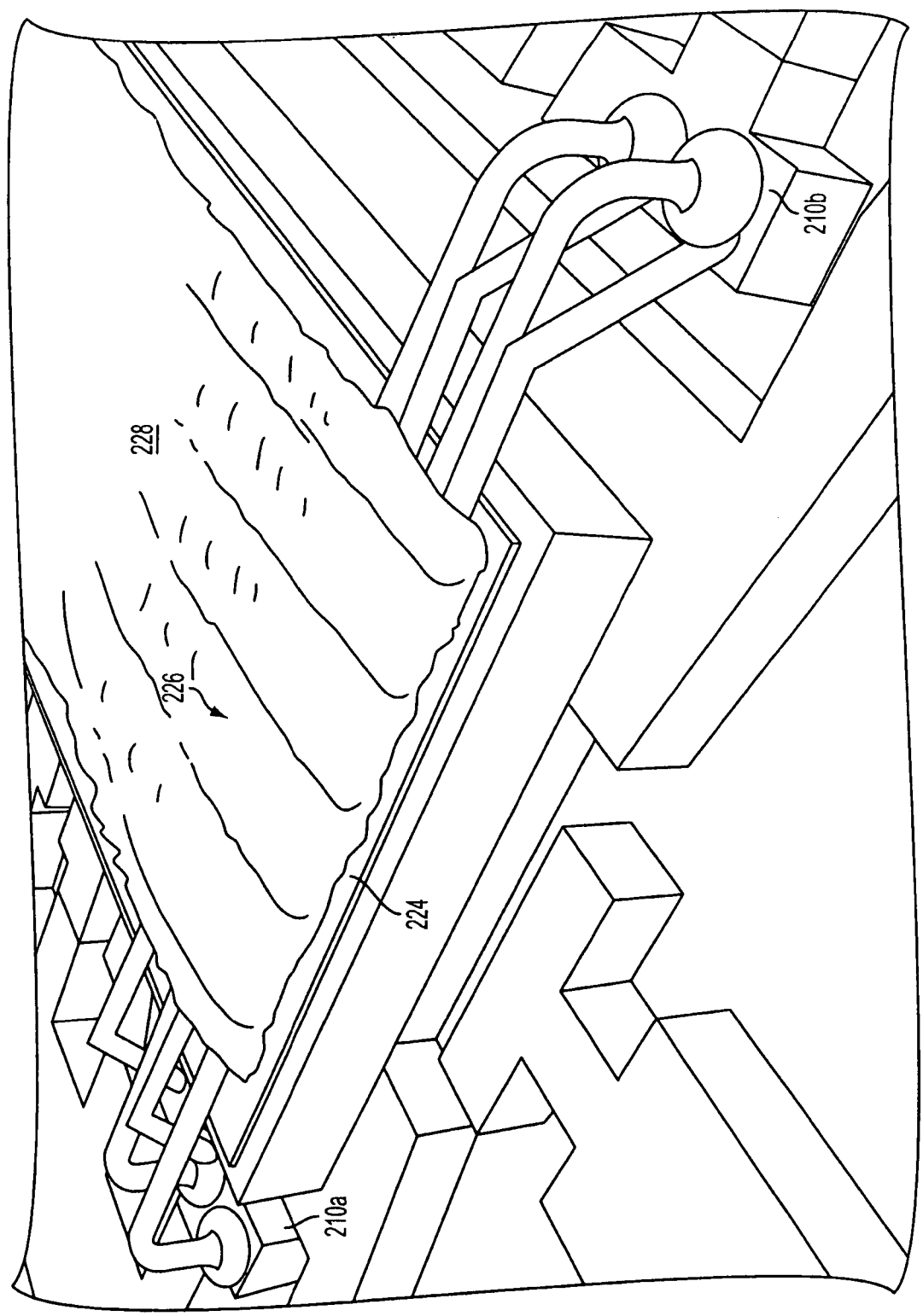
FIG. 3 shows the assembly as solder paste has been applied to the source electrode to enmesh the wires.
Figure 5:
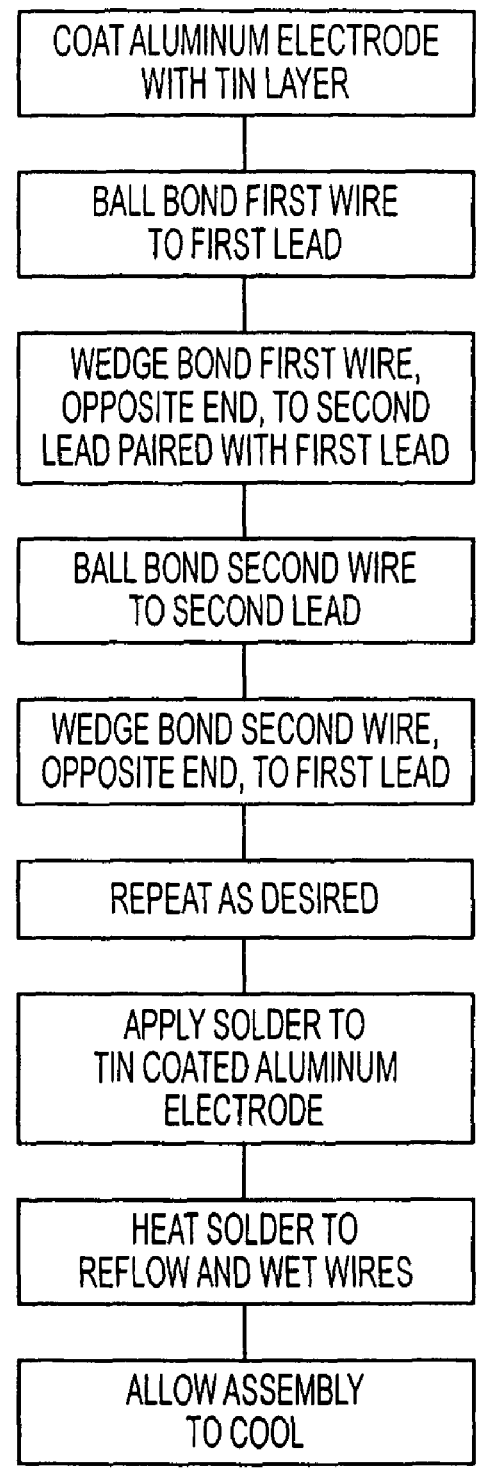
FIG. 5 is a flowchart showing a process of manufacturing a field-effect transistor in accord with the described teachings.

The interconnect structure depicted in FIGS. 2 and 3 is manufactured using a conventional wire bonding tool (not shown), in which the process (summarized by a flow chart in FIG. 5) begins with a ball bond at the left hand side, corner, lead tip 210a. The wire is now drawn tautly to the right in the figure, across and resting immediately above or upon the upper surface of the semiconductor die to terminate with a wedge bond at the right hand side, corner, lead tip 210b. Using the bonding tool, a second wire 226 is next ball bonded to lead tip 210a adjacent and outboard of the wedge bond of the first wire, and is wedge bonded to lead tip 210b adjacent and inboard of the wedge bond of the first wire, as depicted. This process may be repeated on additional wires any number of times using alternate ball and wedge bonds, as described, to form a multiplicity of wires arranged in parallel between a pair of leads, atop the die, and near or in contact with the source electrode 216.

The described process of drawing and welding wires to corresponding leads on opposite sides of the die will preferably continue to be repeated a number of times for each pair of leads. For simplicity of illustration, six pairs of leads, with two pairs of wires spanning the die between one pair of the leads, are shown in the example of FIG. 2. A greater number of such wires connected between leads of the device will create an interconnect of lesser composite resistance. Larger diameter wires similarly will reduce resistance, although wires of 2 mils in diameter are standard. The leads 210 may be oriented as shown to connect all wires in electrical parallel so as to create a low resistance path from the leads to the source electrode of the device.

Figure 4:
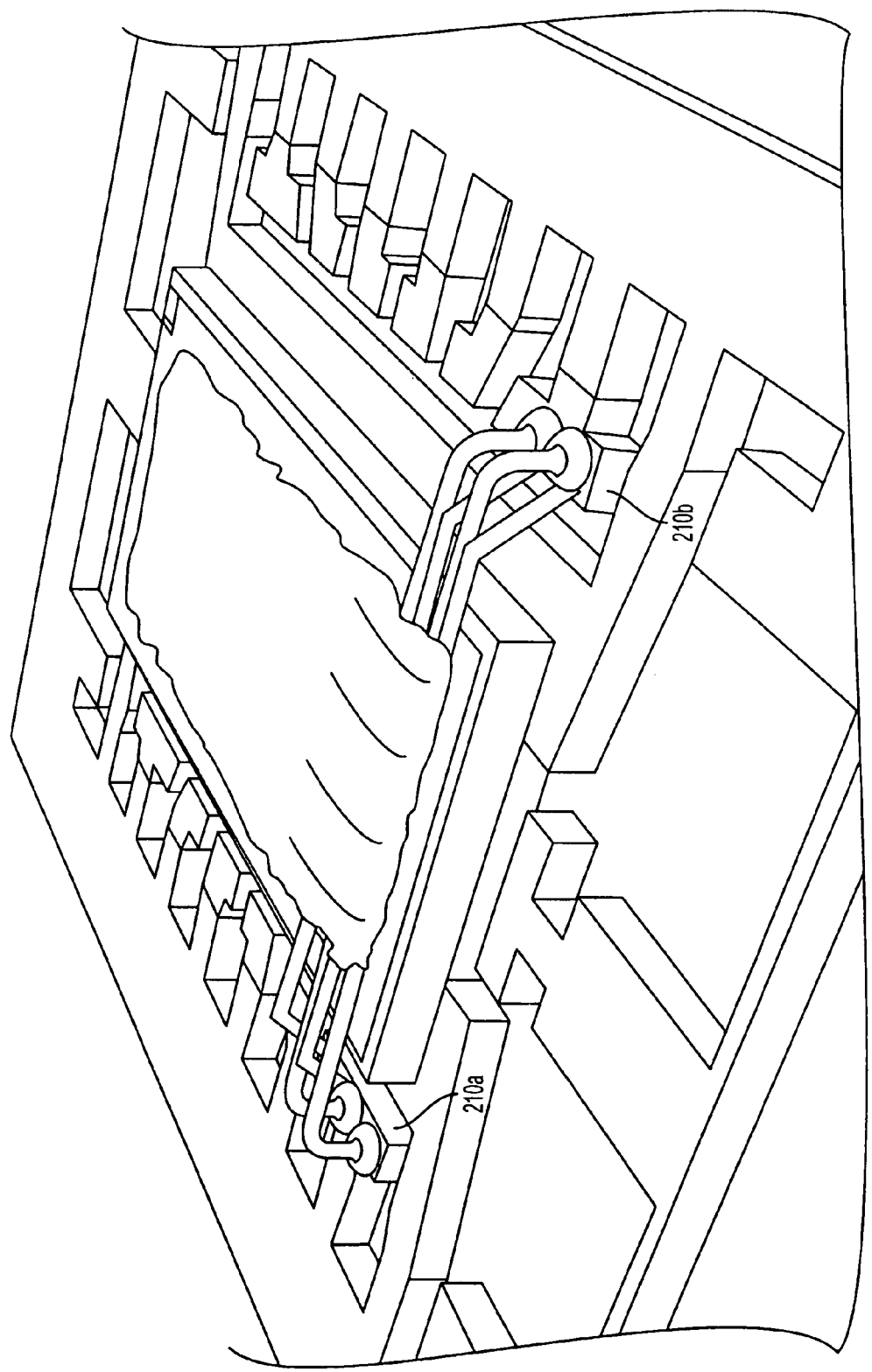
FIG. 4 shows the assembly after the solder paste has cooled and solidified.

Referring to FIG. 3, which is an enlargement of a portion of FIG. 2, a layer 228 of solder is now deposited on the surface of source electrode 216 and wires 210 and then heated, preferably by heating the leadframe, to reflow the solder and wet the copper wires to create a conductive medium that spans a portion or substantially the entire surface of the source electrode. The solder now is allowed to cool, or is cooled, to cause the solder to solidify. The conductive medium that results is of nearly negligible resistance, leaving a residual resistance that resides substantially only between die and lead tips on each side of the device. FIG. 4 shows the device with conductive medium 228, now solidified, in which wires 226 are embedded.

Finally, the assembly will be encapsulated and singulated, in a conventional manner, to produce the desired field-effect transistor or other semiconductor device.

Accordingly, a semiconductor device, such as a field-effect transistor, will have been manufactured, having considerably lower resistance than heretofore available, with associated increased current carrying capability and improvement in performance.

Persons skilled in this art will thus appreciate that the invention can be practiced by other than the described embodiment, which is presented for purpose of illustration and not of limitation, and that the invention is limited only by the claims which follow.

What is claimed is:

1. A semiconductor device, comprising:
a leadframe comprising a die paddle integral with a first set of leads, and a second set of leads electrically isolated from the first set of leads;
a semiconductor die having a first surface positioned on, and electrically connected to, the die paddle;
a layer of conductive material on a second surface of the semiconductor die opposite the first surface; and
at least one electrically conductive wire extending across the second surface of the semiconductor die, in electrical contact with the layer of conductive material, and interconnecting corresponding ones of the second set of leads, wherein
the at least one electrically conductive wire is in contact with the layer of conductive material continuously throughout a region of the layer of conductive material between opposite sides of the semiconductor die.

2. The semiconductor device of claim 1, wherein the wire is attached to the layer of conductive material with a solder.

3. The semiconductor device of claim 1, wherein plural wires extend between an opposed pair of the second set of leads on opposite sides of the paddle.

4. The semiconductor device of claim 2, wherein mutually adjacent wire ends are bonded to a common lead by ball and wedge bonds, respectively.

5. The semiconductor device of claim 1, wherein the layer of conductive material is nickel-coated aluminum.

6. The semiconductor device of claim 1, wherein the wire is made of copper.

7. The semiconductor device of claim 1, wherein the die is attached to the die paddle by a solder or paste.

8. The semiconductor device of claim 1, wherein the device is a field-effect transistor having a first electrode formed by the first surface of the semiconductor die, a second electrode formed by the layer of conductive material, and a gate electrode.

9. The semiconductor device of claim 1, wherein the at least one electrically conductive wire extending across the second surface of the semiconductor die interconnects corresponding ones of the second set of leads located on the opposite sides of the die paddle.

10. The semiconductor device of claim 1, wherein:
the second set of leads includes a first lead and a second lead,
the first lead is located on one side of the die paddle,
the second lead is located on the other and opposite side of the die paddle,
one end of the at least one electrically conductive wire is connected to the first lead and the other end of the at least one electrically conductive wire is connected to the second lead.

11. The semiconductor device of claim 1, wherein the conductive wire is not ball or wedge bonded to the layer of conductive material.

12. A method of manufacturing a semiconductor device, comprising steps of:
on a die paddle, mounting a semiconductor die having an upper surface on which a metal layer is formed, the die paddle being integral with a first set of leads, and the semiconductor die being surrounded at least on two sides by a second set of leads that is electrically isolated from the first set of leads;
connecting opposite ends of a wire respectively to corresponding leads of the second set of leads, such that the wire spans across and resides on or above the metal layer;
applying a solder to the wire and metal layer; and
cooling the solder or allowing the solder to cool to secure the wire to the metal layer, wherein
the wire is in contact with the metal layer continuously throughout a region of the metal layer between opposite sides of the semiconductor die.

13. The method of manufacturing a semiconductor device as in claim 12, in which two or more wires are connected between corresponding second leads.

14. The method of manufacturing a semiconductor device as in claim 13, in which the two or more wires are bonded between common leads using ball and wedge bonds, alternately, on each lead.

15. The method of manufacturing a semiconductor device as in claim 12, wherein the solder is melted by heating the die paddle.

16. The method of manufacturing a semiconductor device as in claim 12, wherein the metal layer includes aluminum coated with a solderable material, and the wire is made of copper.

17. The method of manufacturing a semiconductor device as in claim 16, in which the metal layer includes aluminum coated with nickel.

* * * * *